US012444563B2

(12) United States Patent
Li et al.

(10) Patent No.: US 12,444,563 B2
(45) Date of Patent: Oct. 14, 2025

(54) ELECTRIC-DRIVEN TRIP AND RESET MECHANISM AND RELATED LEAKAGE CURRENT PROTECTION DEVICE

(71) Applicant: Chengli Li, Suzhou (CN)

(72) Inventors: Chengli Li, Suzhou (CN); Xiaoming Zhang, Suzhou (CN)

(73) Assignee: Chengli Li, Suzhou (CN)

( * ) Notice: Subject to any disclaimer, the term of this patent is extended or adjusted under 35 U.S.C. 154(b) by 158 days.

(21) Appl. No.: 18/469,478

(22) Filed: Sep. 18, 2023

(65) Prior Publication Data

US 2025/0069838 A1 Feb. 27, 2025

(30) Foreign Application Priority Data

Aug. 21, 2023 (CN) ......................... 202311051328.1
Aug. 21, 2023 (CN) ......................... 202322242886.8

(51) Int. Cl.
*H01H 71/32* (2006.01)
*G01R 31/52* (2020.01)
*H01H 71/10* (2006.01)

(52) U.S. Cl.
CPC ...... *H01H 71/325* (2013.01); *H01H 71/1072* (2013.01); *G01R 31/52* (2020.01); *H01H 2071/328* (2013.01)

(58) Field of Classification Search
CPC ............. H01H 71/325; H01H 71/1072; H01H 2071/328; G01R 31/52
USPC ........................................................... 361/71
See application file for complete search history.

(56) References Cited

U.S. PATENT DOCUMENTS

| | | | | |
|---|---|---|---|---|
| 5,289,148 | A * | 2/1994 | Siglock | H01H 89/06 335/14 |
| 5,594,398 | A * | 1/1997 | Marcou | H01R 13/7135 361/42 |
| 2004/0070897 | A1* | 4/2004 | Wu | H02H 3/338 361/42 |
| 2006/0198066 | A1* | 9/2006 | Chen | H01H 89/08 361/42 |
| 2007/0217100 | A1* | 9/2007 | Chen | H01H 1/50 361/42 |

(Continued)

FOREIGN PATENT DOCUMENTS

| | | | |
|---|---|---|---|
| CN | 107123577 B | * 11/2019 | H01H 71/32 |
| CN | 211700699 U | * 10/2020 | H01R 13/465 |

*Primary Examiner* — Sreeya Sreevatsa
(74) *Attorney, Agent, or Firm* — Chen Yoshimura LLP

(57) ABSTRACT

An electric-driven trip and reset mechanism includes input terminal and output terminals, and a position control unit, which includes a control circuit board and a coil support frame assembly and a magnet support frame assembly both coupled to the control circuit board. The input terminal is mounted on the coil support frame assembly and coupled to the control circuit board; the output terminal is mounted on the magnet support frame assembly and coupled to the control circuit board. The magnet support frame assembly is configured to move between first position farther away from the coil support frame assembly and second position closer to the coil support frame assembly. At the first position, the input and output terminals are disconnected from each other, and at the second position, the input and output terminals are connected to each other. The device can automatically switch between reset and trip functions.

21 Claims, 9 Drawing Sheets

(56) References Cited

U.S. PATENT DOCUMENTS

| | | | | |
|---|---|---|---|---|
| 2009/0206059 | A1 * | 8/2009 | Kiko | G05F 1/66 218/143 |
| 2013/0015928 | A1 * | 1/2013 | Sohn | H01H 71/0228 335/1 |
| 2022/0115200 | A1 * | 4/2022 | Mantoan | H01H 51/01 |

* cited by examiner

ELECTRIC-DRIVEN TRIP AND RESET MECHANISM AND RELATED LEAKAGE CURRENT PROTECTION DEVICE

BACKGROUND OF THE INVENTION

This invention relates generally to leakage current protection devices, and in particular, it relates to an electric-driven trip and reset mechanism, and related leakage current protection device employing such trip and reset mechanism.

With increased safety awareness, leakage current interrupters or leakage current projection devices (including power plugs with leakage current protection and power receptacles with leakage current protection) are becoming widely used. However, existing leakage current protection devices require manual operation by the users to reset the device after it is tripped. This is inconvenient for the users.

SUMMARY OF THE INVENTION

Accordingly, the present invention is directed to an improved leakage current protection device with electric-driven reset (automatic reset) and tripping. Such devices can improve user experience while ensuring safety.

In one aspect, the present invention provides a An electric-driven trip and reset mechanism, which includes: at least one input terminal; at least one output terminal; and a position control unit, including: a control circuit board, and a coil support frame assembly and a magnet support frame assembly both coupled to the control circuit board; wherein the input terminal is mounted on the coil support frame assembly and coupled to the control circuit board, the output terminal is mounted on the magnet support frame assembly and coupled to the control circuit board, wherein the magnet support frame assembly is configured to move between a first position farther away from the coil support frame assembly and a second position closer to the coil support frame assembly, wherein at the first position, the input terminal and output terminal are disconnected from each other, and at the second position, the input terminal and output terminal are connected to each other.

The invention may be implemented in any one or more of the following embodiments.

In some embodiments, the at least one input terminal includes a pair of input connection plates, wherein each one of the pair of input connection plates is connected at one end to the control circuit board and has an electrical contact terminal at another end. In some embodiments, the pair of input connection plates are resilient plates.

In some embodiments, the at least one output terminal includes a pair of output connection plates, wherein each one of the pair of output connection plates is connected at one end to the control circuit board via a flexible output wire and has an electrical contact terminals at another end.

In some embodiments, the pair of output connection plates are resilient plates.

In some embodiments, the coil support frame assembly includes a coil support frame, a first coil and a second coil wound around the coil support frame, and a first iron core and a second iron core respectively nested inside the first coil and second coil, wherein one end of the coil support frame forms a position limiting cavity configured to accommodate the magnet support frame assembly and to limit its position, wherein the position limiting cavity is configured to allow the magnet support frame assembly to move between the first position and the second position.

In some embodiments, the first iron core is a reset iron core, the second iron core is a trip iron core and is disposed near the magnet support frame assembly, and wherein the magnet support frame assembly includes a magnet support frame and a permanent magnet disposed inside the magnet support frame.

In some embodiments, at the first position, the first iron core and the second iron core are in their initial positions which are farther away from the permanent magnet, and at the second position, the second iron core and the permanent magnet are attracted by magnetic force to contact each other.

In some embodiments, the magnet support frame assembly has at least one hook, wherein the position limiting cavity defines at least one corresponding slot on its wall, and wherein the hook extends from within the position limiting cavity via the slot and is moveable along the slot.

In some embodiments, the first coil and the second coil are disposed coaxially, wherein the coil support frame assembly further includes an iron core attachment member disposed between the first iron core and second iron core and a reset spring nested around at least the iron core attachment member, wherein the iron core attachment member has an outwardly extending circular rib, and wherein the reset spring is disposed between the circular rib and the coil support frame and configured to urge at least the iron core attachment member to return to its initial position.

In some embodiments, the coil support frame assembly further includes a position limiting block, which has a position limiting slot corresponding to the iron core attachment member, configured to abut a side of the circular rib that is opposite the reset spring.

In some embodiments, the iron core attachment member is fixedly joined to both the first iron core and second iron core to form one body.

In some embodiments, the iron core attachment member is fixedly joined to the second iron core to form one body, wherein the first iron core is separate from the attachment member, wherein the coil support frame assembly further includes an auxiliary spring disposed around the first iron core and configured to urge the first iron core to its initial position.

In some embodiments, the position control unit further includes a trip spring, disposed in the position limiting cavity of the coil support frame assembly and configured to urge the magnet support frame assembly toward its first position.

In some embodiments, the position control unit is configured to communicate with an external mobile terminal or remote device, to remotely control a current flow in the first or second coil.

In another aspect, the present invention provides a leakage current protection device, including a shell and a movement assembly disposed in a shell, wherein the movement assembly includes the electric-driven trip and reset mechanism of claim 1.

The electric-drive trip and reset mechanism according to embodiments of the present invention can achieve automatic switching between reset function and trip function using the position control unit. This improves the automation of the device, avoids uncertainty of manual operations, and ensures stable and reliable operation of the device. Further, the electric-drive trip and reset mechanism has a simple structure, is easy to manufacture, is suitable for mass production and has wide applicability.

BRIEF DESCRIPTION OF DRAWINGS

Other features and advantages of the present invention may be understood from the embodiments described below with reference to the drawings.

DETAILED DESCRIPTION OF THE INVENTION

Preferred embodiments of the present and their applications are described below. It should be understood that these descriptions describe embodiments of the present invention but do not limit the scope of the invention. When describing the various components, directional terms such as "up," "down," "top," "bottom" etc. are not absolute but are relative. These terms may correspond to the views in the various illustrations, and can change when the views or the relative positions of the components change.

In this disclosure, terms such as "connect", "couple", "link" etc. should be understood broadly; for example, they may be fixed connections, or removable or detachable connections, or integrally connected for integrally formed; they may be directly connected, or indirectly connected via intermediate parts. Those skilled in the relevant art can readily understand the meaning of these terms as used in this disclosure based on the specific description and context.

As discussed earlier, existing leakage current protection devices require manual operation by the users to reset the device after it is tripped. This is inconvenient for the users. To solve this problem, embodiments of the present invention provide an electric-driven trip and reset mechanism, which can automatically switch between a reset function and a trip function based on the need of the leakage current protection device, without requiring manual operation. This ensures safety and improves user experience. In some applications, the trip and reset mechanism has remote controlled reset and trip functions, which further improves user experience.

The descriptions here focus on the electric-driven trip and reset mechanism; leakage current protection devices that employ such trip and reset mechanism include, without limitation, power plugs with leakage current protection and power receptacles with leakage current protection of various forms. Each such leakage current protection device includes a movement assembly disposed in a shell.

Figure 1:
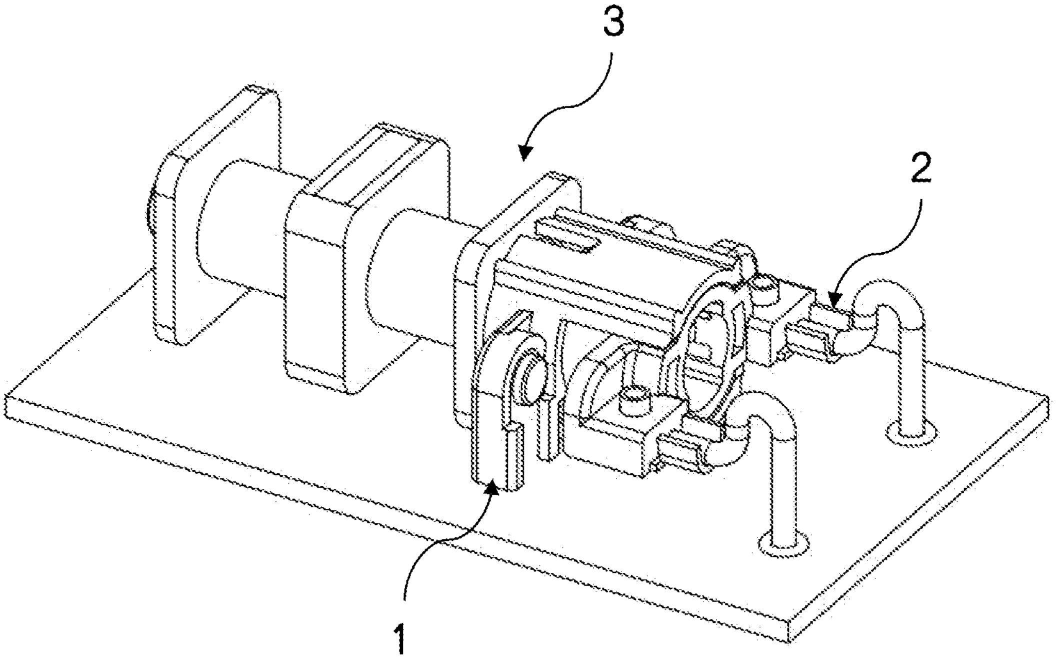
FIG. 1 is an exterior perspective view of an electric-driven trip and reset mechanism according to an embodiment of the present invention.
Figure 2A:
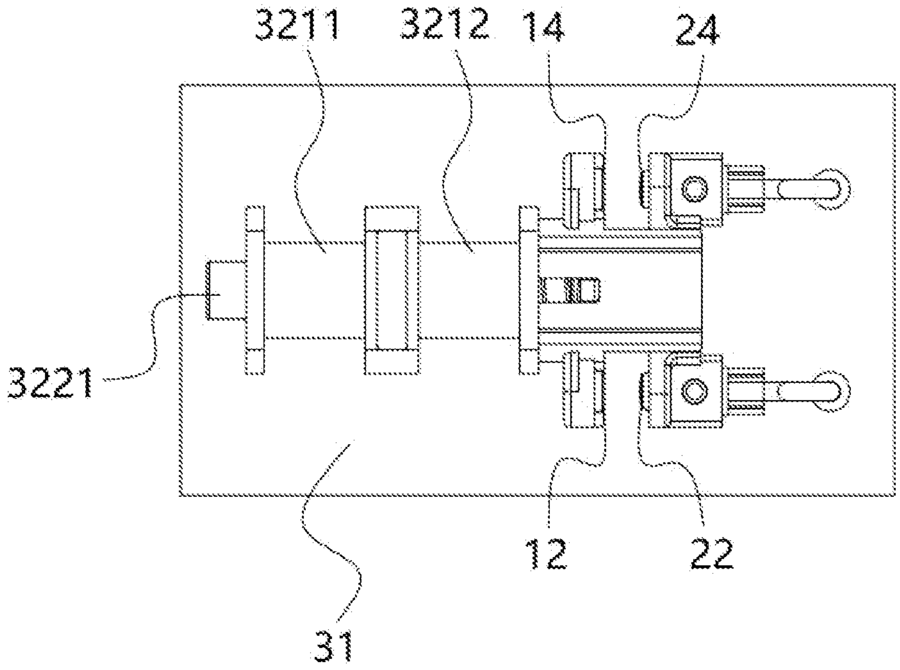
FIGS. 2A and 2B are top view and side view, respectively, of the trip and reset mechanism of FIG. 1.
Figure 2B:
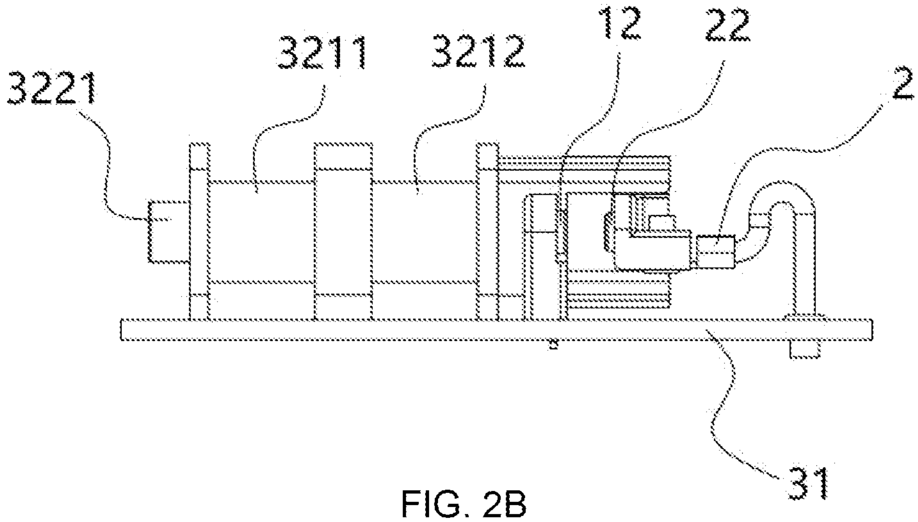
Figure 3:
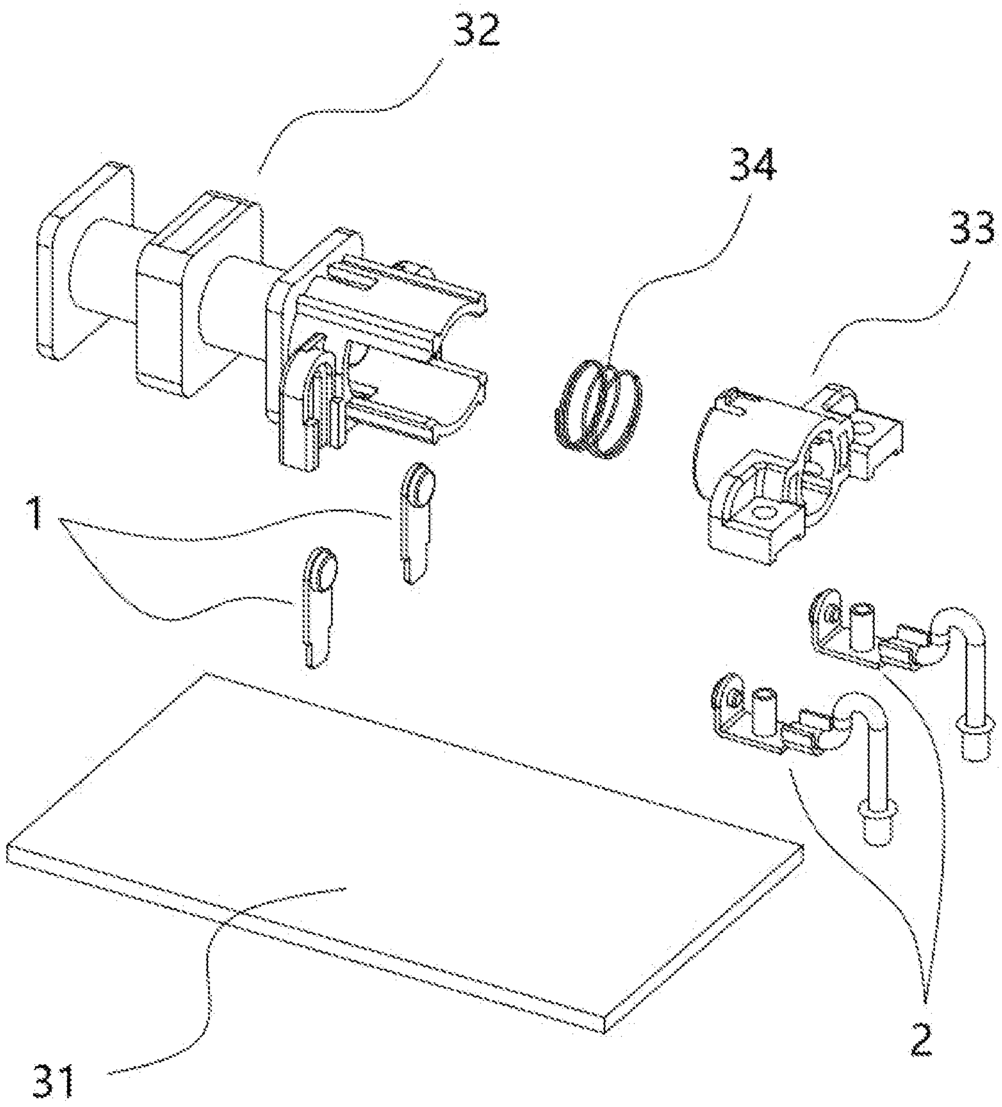
FIG. 3 is an exploded view of the trip and reset mechanism of FIG. 1.

FIG. 1 shows an electric-driven trip and reset mechanism according to an embodiment of the present invention. The trip and reset mechanism is a part of a movement assembly that is disposed in a leakage current protection device. In the illustrated embodiment, the electric-driven trip and reset mechanism includes at least one input terminal 1, at least one output terminal 2, and a position control unit 3. As shown in FIG. 3, the position control unit 3 includes a control circuit board 31, and a coil support frame assembly 32 and a magnet support frame assembly 33 both coupled to the control circuit board 31. The magnet support frame assembly 33 is configured to move between a first position farther away from the coil support frame assembly 32 and a second position closer to the coil support frame assembly 32. At the first position, the input terminal 1 and output terminal 2 are in a disconnected (open) state; at the second position, the input terminal 1 and output terminal 2 are in a connected (closed) state. This way, by controlling the relative position between the magnet support frame assembly 33 and coil support frame assembly 32, the device can be accurately and conveniently switch between the reset state and the tripped state. Preferably, the control of the relative position may be achieved by the magnetic field relationship between the coil support frame assembly 32 and the magnet support frame assembly 33.

Figure 4:
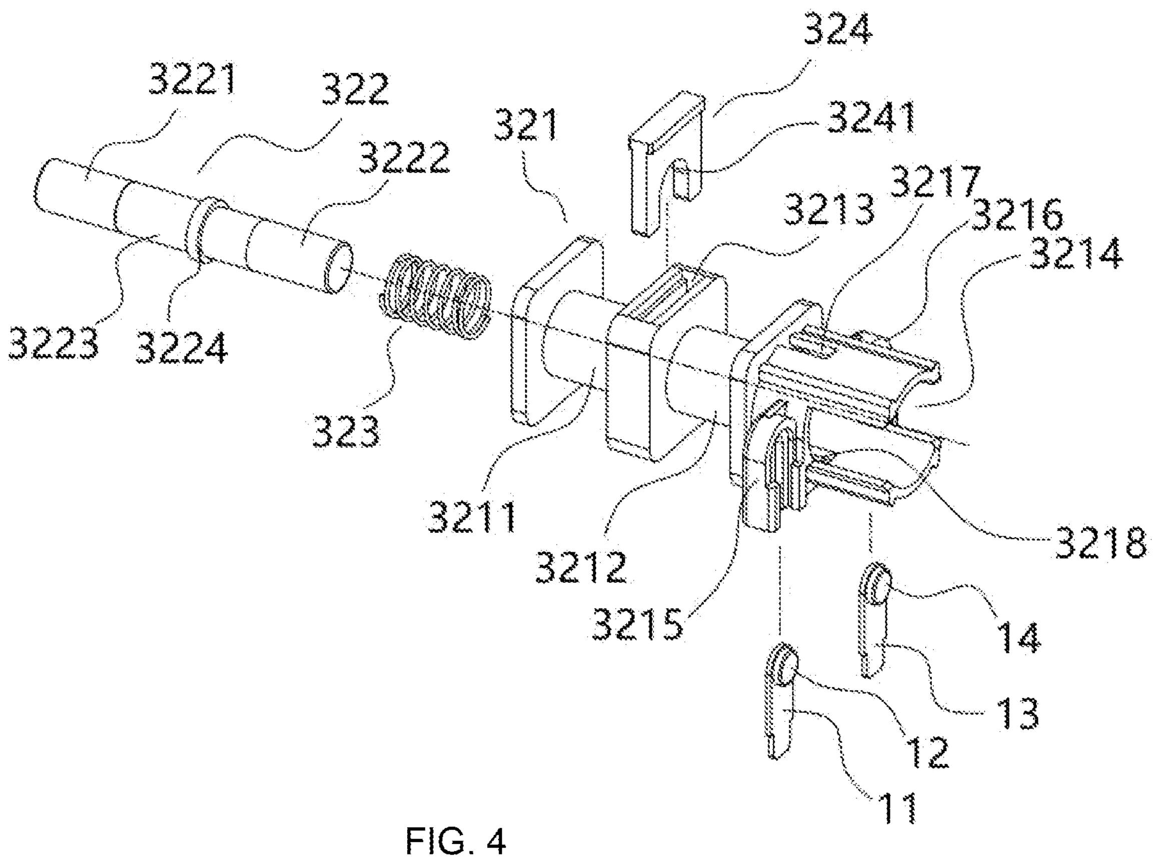
FIG. 4 is an exploded view of the coil support frame assembly of the trip and reset mechanism of FIG. 1, showing one implementation of the iron core assembly.

In some embodiment, the input terminal 1 includes a pair of input connection plates, such as a hot input connection plate 11 and a white input connection plate 13 shown in FIG. 4. The pair of input connection plates are connected at one end to the control circuit board 31, and are provided with electrical contact terminals at the other end, such as a hot input contact terminal 12 and a white input contact terminal 14, respectively. In some embodiments, the output terminal 2 includes a pair of output connection plates, such as a hot output connection plate 21 and a white output connection plate 23 shown in FIG. 5. The pair of output connection plates are connected at one end to the control circuit board 31 by flexible output wires 25, 26, respectively, and are provided with electrical contact terminals at the other end, such as a hot output contact terminal 22 and a white output contact terminal 24, respectively.

Figure 5:
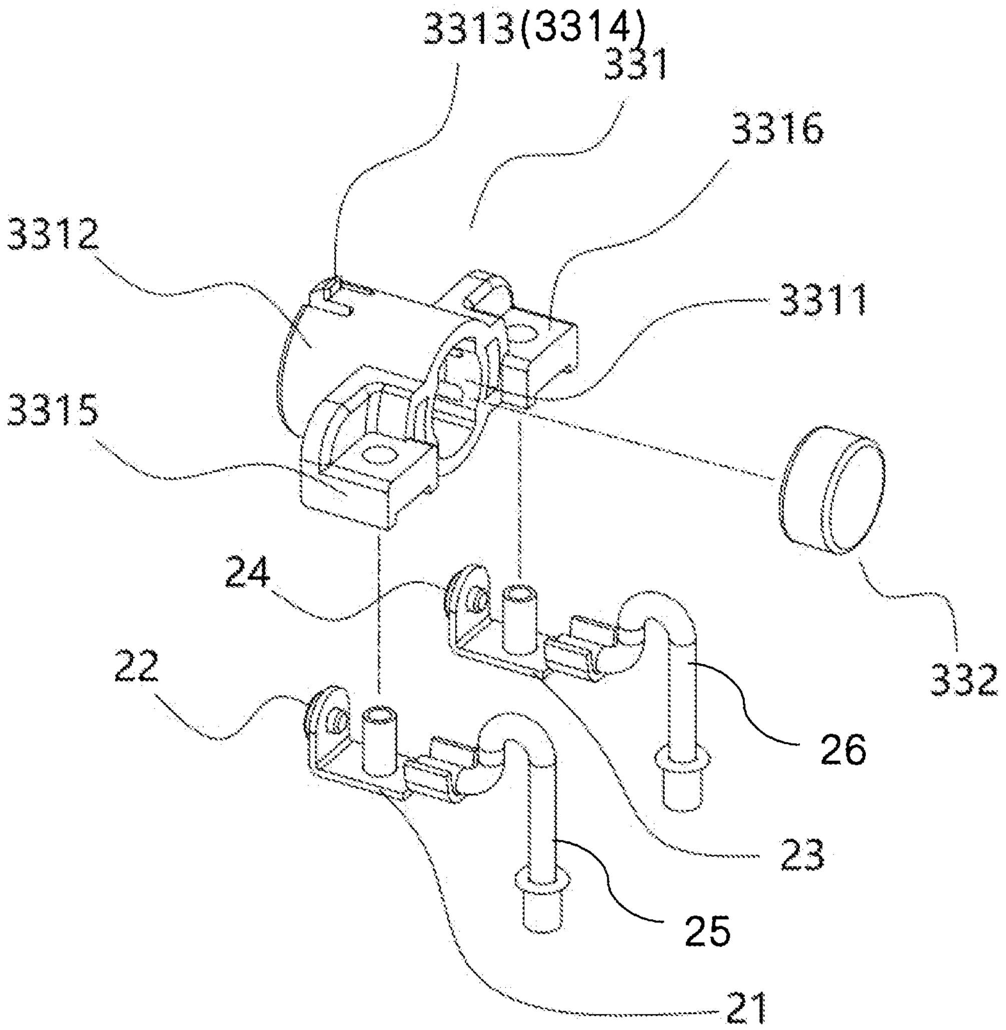
FIG. 5 is an exploded view of the output terminal and the magnet support frame assembly of the trip and reset mechanism of FIG. 1.

In some embodiments, the input terminal 1 is mounted on the coil support frame assembly 32 and coupled to the control circuit board 31, and the output terminal 2 is mounted on the magnet support frame assembly 33 and coupled to the control circuit board 31. For example, as shown in FIG. 4, the coil support frame assembly 32 includes a coil support frame 321, which have mounting ears 3215 and 3216 on its two sides, respectively, for mounting the hot input connection plate 11 and white input connection plate 13, respectively. The input terminal 1 and coil support frame assembly 32 can then be mounted on the control circuit board 31 together. As shown in FIG. 5, the magnet support frame assembly 33 includes a magnet support frame 331, which has mounting arms 3315 and 3316 on its two sides, respectively, for mounting the hot output connection plate 21 and the white output connection plate 23, respectively. Because one ends of the hot and white output connection plates 21 and 23 are respectively connected to the control circuit board 31 by flexible output wires 25 and 26, the output connection plates 21 and 23 can move with the magnet support frame assembly 33 without hindrance. Preferably, the input connection plates 11 and 13 and/or the output connection plates 21 and 23 are resilient plates, which further allows the relative movement of the magnet support frame assembly 33 and coil support frame assembly 32 without damage.

Referring back to FIG. 4, in some embodiments, the coil support frame assembly 32 includes the coil support frame 321 and a first coil 3211 and a second coil 3212 wound around the coil support frame 321. A first iron core 3221 and a second iron core 3222 are respectively nested inside the first coil 3211 and second coil 3212. In the illustrated embodiment, the first iron core 3221 is the reset iron core, and the second iron core 3222 is the trip iron core. One end of the coil support frame 321 forms a position limiting cavity 3214 configured to accommodate the magnet support frame assembly 33 and to limit its position. Preferably, the position limiting cavity 3214 is shaped to allow the magnet support frame assembly 33 to move between the first position and the second position. As shown in FIG. 5, in the illustrated embodiment, the magnet support frame assembly 33 includes a magnet support frame 331 and a permanent magnet 332 disposed within the magnet support frame 331. The magnet support frame 331 may be shaped as a hollow cylinder, where the hollow space 3311 accommodates the permanent magnet 332. The second iron core 3222 is disposed near the magnet support frame assembly 33, so that at the first position, the first iron core 3221 and the second iron core 3222 are in their initial positions which are sufficiently far away from the permanent magnet 332 (i.e., so that the magnetic force between the second iron core 3222 and the permanent magnet 332 is insufficient to attract the second iron core 3222 and the permanent magnet 332 to contact each other), and at the second position, the second iron core 3222 is at a position where a sufficiently strong magnetic force exists between the second iron core 3222 and the permanent magnet 332 so that the two are attracted to contact each other, thereby achieving the connection between the input terminal and output terminal. Note that in this disclosure, the initial positions of various components are their positions when the trip and reset mechanism is in the open state.

To facilitate the movement of the magnet support frame assembly 33 in the position limiting cavity 3214 between the first position and the second position, the magnet support frame assembly 33 is provided with at least one hook on its outer wall 3312, and the position limiting cavity 3214 is provided with at least one corresponding slot on its wall. As shown in FIGS. 4 and 5, the position limiting cavity 3214 is provided with a pair of symmetrically located slots 3217 and 3218, and the magnet support frame assembly 33 is provided with a pair of symmetrically located hooks 3313 and 3314. The hooks 3313 and 3314 extend from within the position limiting cavity 3214 via slots 3217 and 3218 and are moveable along the slots 3217 and 3218. In other words, the sizes (lengths) of the slots 3217 and 3218 limit the movement range of the magnet support frame assembly 33 between the first and second positions. It should be understood that the sizes of the slots may be set according to need.

In some embodiments, the position control unit 3 further includes a trip spring 34, disposed in the position limiting cavity 3214 of the coil support frame assembly 32 to urge the magnet support frame assembly 33 toward its first position. More specifically, the two ends of the trip spring 34 respectively abut the inner end surfaces of the position limiting cavity 3214 and the hollow space 3311 of the magnet support frame assembly 33. When the second iron core 3222 and the permanent magnet 332 are not attracted to each other sufficiently, the trip spring 34 helps to return the magnet support frame assembly 33 to its first position which is farther away from the coil support frame assembly 32; under the resilience force of the trip spring 34 and the position-limiting function of the hooks 3313 and 3314 and slots 3217 and 3218, the input terminal 1 and output terminal 2 are maintained at the disconnected state.

Preferably, the first coil 3211 and the second coil 3212 are disposed coaxially, and correspondingly, the first iron core 3221 and the second iron core 3222 are disposed coaxially. In some embodiments, the coil support frame assembly 32 further includes an iron core attachment member 3223 connected between the first iron core 3221 and second iron core 3222, and a reset spring 323 nested around at least the attachment member 3223. The attachment member 3223 has an outwardly extending circular rib 3224, and the reset spring 323 is disposed between the circular rib 3224 and the coil support frame 321 and functions to urge at least the attachment member 3223 to return to its initial position.

In the illustrated embodiment, the iron core attachment member 3223 and the first and second iron cores 3221 and 3222 together form the iron core assembly 322. For example, in the embodiment shown in FIG. 6A, the attachment member 3223 is mechanically fixedly joined to both the first iron core 3221 and second iron core 3222, respectively, so that the three form one body. This way, the reset spring 323 can reset the attachment member 3223 and the first and second iron cores 3221 and 3222 together to their initial positions.

Figure 9A:
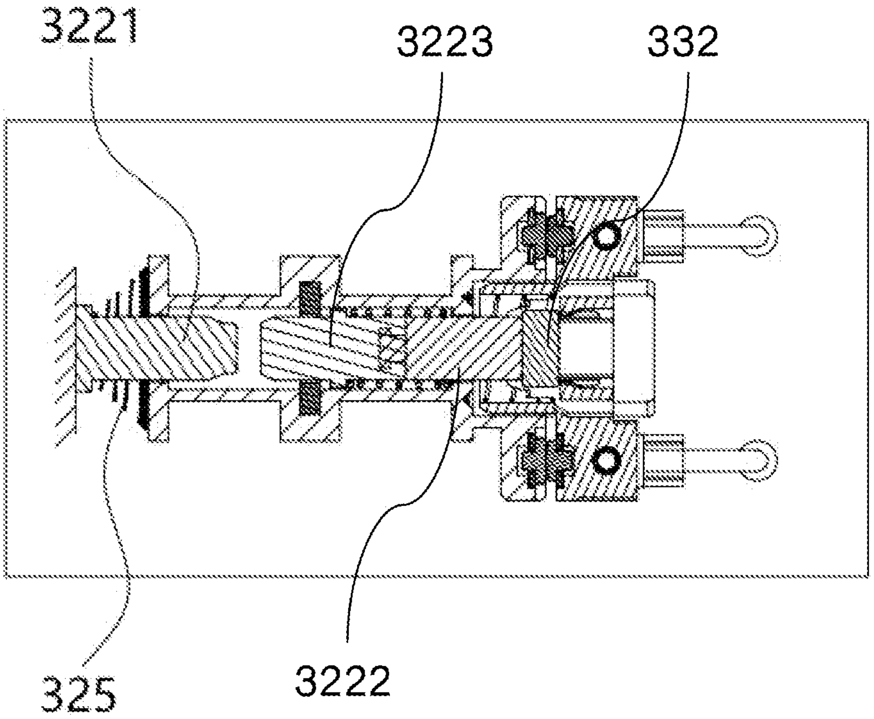
FIGS. 9A and 9B are cross-sectional views of the trip and reset mechanism using the coil support frame assembly of FIG. 7, when the input and output terminals are in a closed state and an open state, respectively.
Figure 9B:
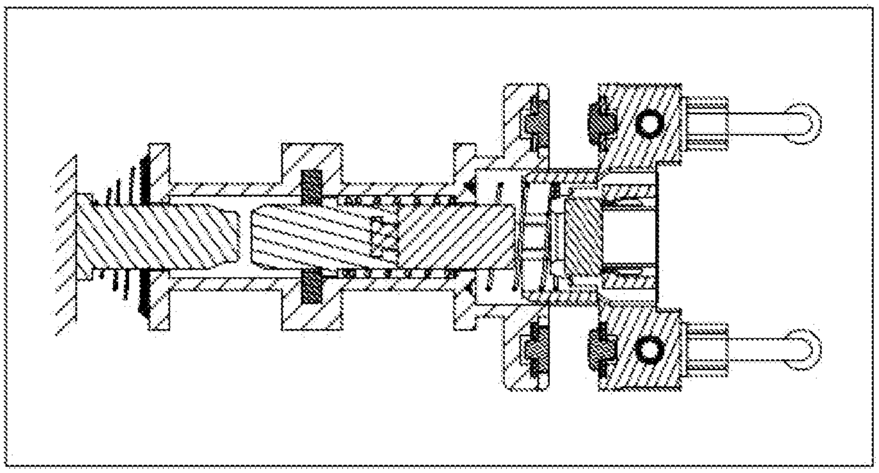

In an alternative embodiment, shown in FIGS. 7-9B, the attachment member 3223 is only fixedly joined to the second iron core 3222 into one body, e.g., by a fixed mechanical connection as shown in FIG. 9A. The first iron core 3221 is separate from the attachment member 3223; an auxiliary spring 325 is disposed around the first iron core 3221, between a circular rib of the first iron core 3221 and a flange of the coil support frame 321 to urge the first iron core 3221 to its initial position.

In some embodiment, the coil support frame assembly 32 further includes a position limiting block 324, which has a position limiting slot 3241 corresponding to the iron core attachment member 3223, to abut the side of the circular rib 3224 that is opposite the reset spring 323. More specifically, as shown in FIG. 4, the two opposite ends of the two bobbins of the first coil 3211 and second coil 3212 respectively have sidewalls to constrain the windings, and the common sidewall of the two bobbins has a position limiting hole 3213 for accommodating the position limiting block 324. When the position limiting block 324 is fitted around the iron core attachment member 3223 and abuts the side of the circular rib 3224 that is opposite to the reset spring 323, it limits the second iron core 3222 at its initial position or urges the second iron core 3222 toward its initial position.

Figure 6A:
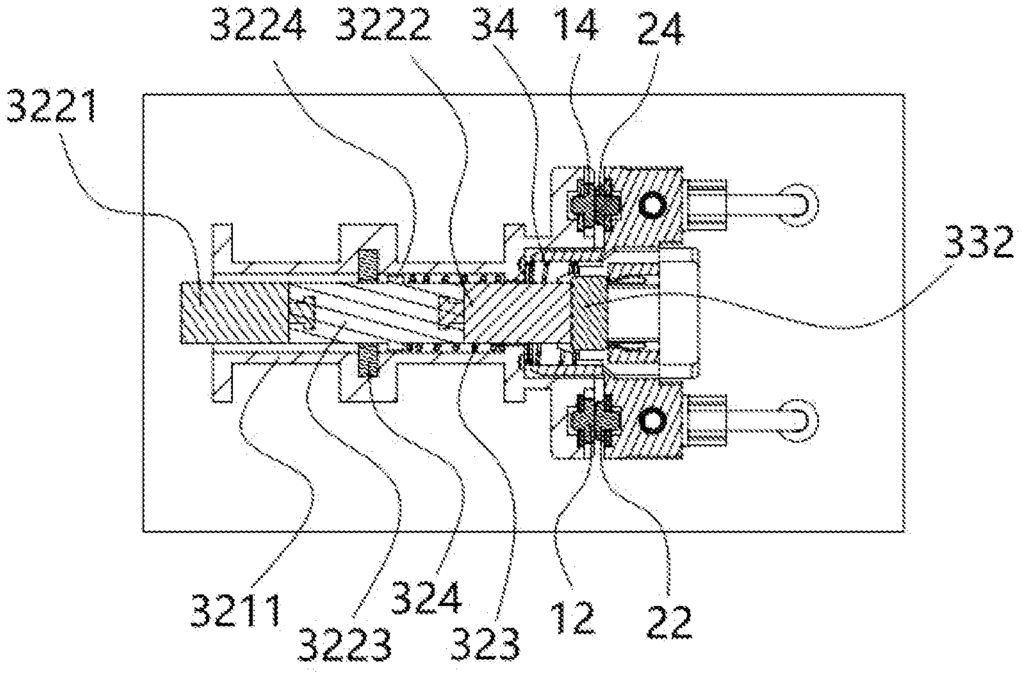
FIGS. 6A and 6B are a cross-sectional views of the trip and reset mechanism of FIG. 1 when the input and output terminals are in a closed state and an open state, respectively.

The operation of the electric-driven trip and reset mechanism is described below with reference to FIGS. 6A and 6B.

Figure 6B:
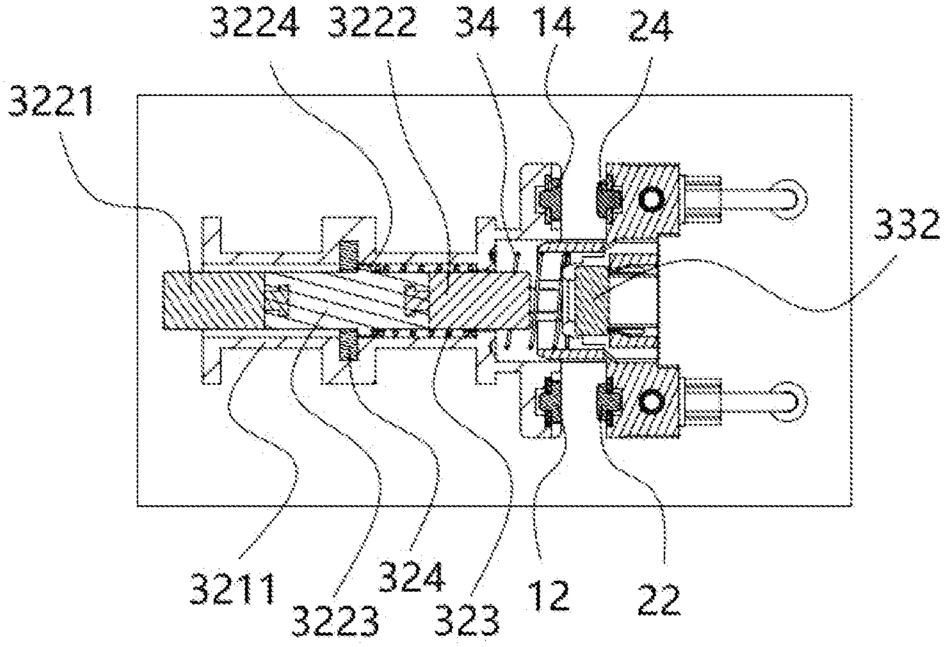
Figure 7:
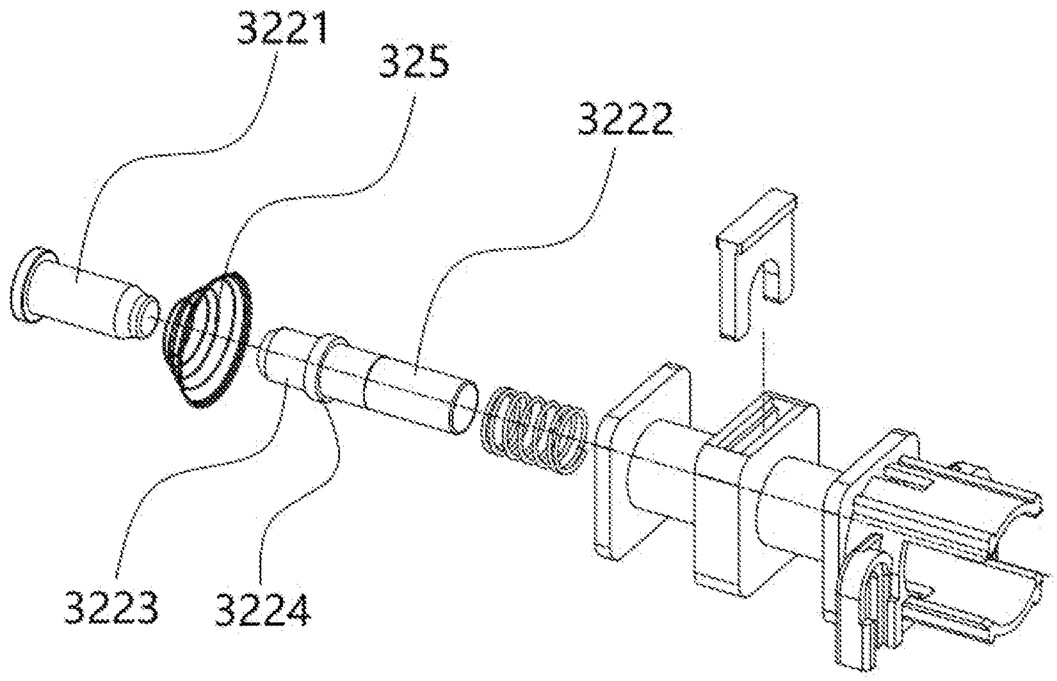
FIG. 7 is an exploded view of the coil support frame assembly of the trip and reset mechanism, showing another implementation of the iron core assembly.
Figure 8:
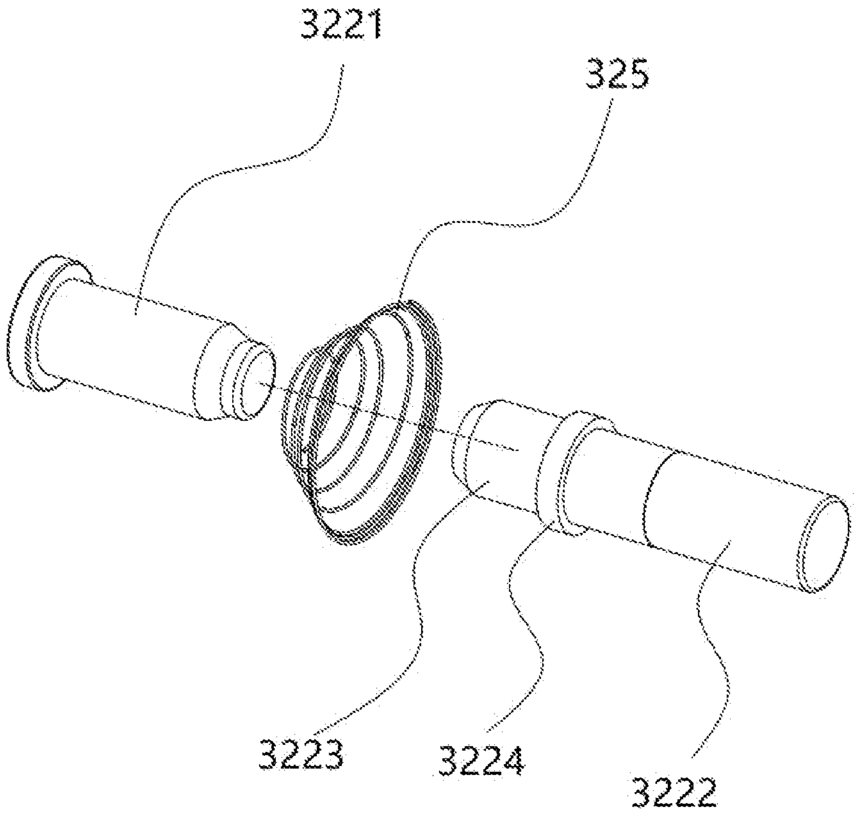
FIG. 8 is an exploded view of the iron core assembly of FIG. 7.

In the initial state, shown in FIG. 6B, the magnet support frame assembly 33 is at the first position, and the input terminal 1 and output terminal 2 are disconnected. The first iron core 3221 (reset iron core) is partially disposed inside the first coil 3211, and partially disposed outside. At this position, the reset spring 323 is compressed; one end of it abuts the inside wall at the edge of the second coil 3212 of the coil support frame 321, and the other end of it abuts one side of the circular rib 3224 of the iron core attachment member 3223. Under the actions of the reset spring 323 and position limiting block 324, the iron core assembly formed jointly by the first iron core 3221, iron core attachment member 3223 and second iron core 3222 is at its initial position.

When the first coil 3211 is momentarily energized (i.e. a current flows through it) and generates a magnetic field, the first iron core 3221 experiences the magnetic force and moves toward the inside of the first coil 3211, and brings with it the iron core attachment member 3223 and the second iron core 3222 (trip iron core) to overcome the resilience force of the reset spring 323 and move toward the permanent magnet 332. When the end of the second iron core 3222 is sufficiently close to the iron core assembly 322, the magnetic attraction force between the permanent magnet 332 and the second iron core 3222 overcomes the resilience force of the trip spring 34, and the permanent magnet 332 and second iron core 3222 are attached together by magnetic attraction force. When the first coil 3211 loses power, the first iron core 3221 loses the magnetic force from the first coil 3211; thus, under the resilience force of the reset spring 323, it brings the iron core assembly 322 as well as the magnet support frame assembly 33 and output terminal 2 to move together toward the second position, causing the input terminal 1 and output terminal 2 to be connected. When the input terminal 1 and output terminal 2 are connected, the vector sum of the resilience forces of the reset spring 323 and the trip spring 34 is insufficient to overcome the magnetic attraction force between the permanent magnet 332 and the second iron core 3222; under this condition, and taking into account the contact pressure between the input terminal 1 and output terminal 2, the magnet support frame assembly 33 and the output terminal 2 are maintained at the second position, i.e., the trip and reset mechanism is in the reset state, as shown in FIG. 6A.

In the reset state, if a current in a specified direction flows through the second coil 3212, such that the end of the second iron core 3222 and the end of the permanent magnet 332 facing toward each other have the same magnetic pole, due to the repelling magnetic force between the two like magnetic poles, the permanent magnet 332 and the second iron core 3222 are detached from each other. In this state, under the resilience force of the trip spring 34 and the repelling magnetic force jointly, the magnet support frame assembly 33 and the output terminal 2 return to the initial position (first position), where the input terminal 1 and output terminal 2 are disconnected from each other and the trip and reset mechanism is in the tripped state.

In the embodiment shown in FIGS. 7-9B, the first iron core 3221 is independent of the iron core attachment member 3223 and the second iron core 3222, and separated from them in the axial direction. In the initial state, under the force of the auxiliary spring 325, the first iron core 3221 is in the initial position shown in FIG. 9B, and the iron core attachment member 3223 and the second iron core 3222 are also in their initial positions. When the first coil 3211 generates a magnetic force, the force urges the first iron core 3221 to move toward the inside of the first coil 3211 and strike the iron core attachment member 3223. This in turn causes the second iron core 3222 to move toward the permanent magnet 332, causing them to be attached to each other due to magnetic attraction. When the first coil 3211 loses power and does not generate a magnetic field, the first iron core 3221 is urged by the auxiliary spring 325 to return to its initial position, whereas under the resilience force of the reset spring 323, the iron core attachment member 3223 and the second iron core 3222 along with the magnet support frame assembly 33 and the output terminal 2 still move together toward the second position, causing the input terminal 1 and output terminal 2 to be connected. The magnet support frame assembly 33 and the output terminal 2 are maintained at the second position, and the trip and reset mechanism is in the reset state as shown in FIG. 9A. Similarly, in the reset state, if a current in a specified direction flows through the second coil 3212 such that the permanent magnet 332 and second iron core 3222 are detached from each other due to the repelling magnetic force, under the resilience force of the trip spring 34 and the repelling magnetic force jointly, the magnet support frame assembly 33 and the output terminal 2 return to the initial position (first position) shown in FIG. 9B, so that the input terminal 1 and the output terminal 2 are disconnected from each other and the trip and reset mechanism is in the tripped state.

From the above description, it can be seen that the electric-drive trip and reset mechanism according to embodiments of the present invention can achieve automatic switching between reset function and trip function using the position control unit. This improves the automation of the device, avoids uncertainty of manual operations, and ensures stable and reliable operation of the device. In some additional embodiments, the position control unit 3 may be provided with the ability to communicate with an external mobile terminal (e.g., smart phone) or remote device (e.g., a computer), to remotely control the current flow in the first or second coil and therefore the reset and trip functions. For example, wireless communication chips and control chips may be provided on the control circuit board, so that a leakage current protection device employing the electric-drive trip and reset mechanism according to embodiments of the present invention can achieve remote control of switching between reset and trip states using smart phones, computers, etc. via communication networks. This provides further convenience to the user and improves the range of application of the device.

It should be understood that the embodiments shown in the drawings only illustrate the preferred shapes, sizes and spatial arrangements of the various components of the electric-driven trip and reset mechanism. These illustrations do not limit the scope of the invention; other shapes, sizes and spatial arrangements may be used without departing from the spirit of the invention.

It will be apparent to those skilled in the art that various modification and variations can be made in the embodiments of the present invention without departing from the spirit or scope of the invention. Thus, it is intended that the present invention cover modifications and variations that come within the scope of the appended claims and their equivalents.

The invention claimed is:

1. An electric-driven trip and reset mechanism, comprising:

at least one input terminal;

at least one output terminal; and a position control unit, including: a control circuit board, and a coil support frame assembly and a magnet support frame assembly both coupled to the control circuit board;

wherein the coil support frame assembly includes a coil support frame, a first coil and a second coil wound around the coil support frame, and a first iron core and a second iron core respectively nested inside the first coil and second coil, the first iron core and the second iron core being separate iron cores which are either physically separate from each other or are joined to each other by an iron core attachment member, wherein the at least one input terminal is mounted on the coil support frame assembly and coupled to the control circuit board, the at least one output terminal is mounted on the magnet support frame assembly and coupled to the control circuit board, wherein the magnet support frame assembly is configured to move between a first position farther away from the coil support frame assembly and a second position closer to the coil support frame assembly, wherein at the first position, the input terminal and output terminal are disconnected from each other, and at the second position, the input terminal and output terminal are connected to each other.

2. The electric-driven trip and reset mechanism of claim 1, wherein the at least one input terminal includes a pair of input connection plates, wherein each one of the pair of input connection plates is connected at one end to the control circuit board and has an electrical contact terminal at another end.

3. The electric-driven trip and reset mechanism of claim 2, wherein the pair of input connection plates are resilient plates.

4. The electric-driven trip and reset mechanism of claim 1, wherein the at least one output terminal includes a pair of output connection plates, wherein each one of the pair of output connection plates is connected at one end to the control circuit board via a flexible output wire and has an electrical contact terminals at another end.

5. The electric-driven trip and reset mechanism of claim 4, wherein the pair of output connection plates are resilient plates.

6. The electric-driven trip and reset mechanism of claim 1, wherein one end of the coil support frame forms a position limiting cavity configured to accommodate the magnet support frame assembly and to limit its position, wherein the position limiting cavity is configured to allow the magnet support frame assembly to move between the first position and the second position.

7. The electric-driven trip and reset mechanism of claim 6, wherein the first iron core is a reset iron core, the second iron core is a trip iron core and is disposed near the magnet support frame assembly, and wherein the magnet support frame assembly includes a magnet support frame and a permanent magnet disposed inside the magnet support frame.

8. The electric-driven trip and reset mechanism of claim 6, wherein the magnet support frame assembly has at least one hook, wherein the position limiting cavity defines at least one corresponding slot on its wall, and wherein the hook extends from within the position limiting cavity via the slot and is moveable along the slot.

9. The electric-driven trip and reset mechanism of claim 6, wherein the first coil and the second coil are disposed coaxially, wherein the coil support frame assembly further includes an iron core attachment member disposed between the first iron core and second iron core and a reset spring nested around at least the iron core attachment member, wherein the iron core attachment member has an outwardly extending circular rib, and wherein the reset spring is disposed between the circular rib and the coil support frame and configured to urge at least the iron core attachment member to return to its initial position.

10. The electric-driven trip and reset mechanism of claim 9, wherein the coil support frame assembly further includes a position limiting block, which has a position limiting slot corresponding to the iron core attachment member, configured to abut a side of the circular rib that is opposite the reset spring.

11. The electric-driven trip and reset mechanism of claim 9, wherein the iron core attachment member is fixedly joined to both the first iron core and second iron core to form one body.

12. The electric-driven trip and reset mechanism of claim 9, wherein the iron core attachment member is fixedly joined to the second iron core to form one body, wherein the first iron core is separate from the attachment member, wherein the coil support frame assembly further includes an auxiliary spring disposed around the first iron core and configured to urge the first iron core to its initial position.

13. The electric-driven trip and reset mechanism of claim 6, wherein the position control unit further includes a trip spring, disposed in the position limiting cavity of the coil support frame assembly and configured to urge the magnet support frame assembly toward its first position.

14. The electric-driven trip and reset mechanism of claim 6, wherein the position control unit is configured to communicate with an external mobile terminal or remote device, to remotely control a current flow in the first or second coil.

15. A leakage current protection device, comprising a shell and a movement assembly disposed in a shell, wherein the movement assembly includes the electric-driven trip and reset mechanism of claim 1.

16. An electric-driven trip and reset mechanism, comprising:

at least one input terminal;

at least one output terminal; and a position control unit, including: a control circuit board, and a coil support frame assembly and a magnet support frame assembly both coupled to the control circuit board;

wherein the at least one input terminal is mounted on the coil support frame assembly and coupled to the control circuit board, the at least one output terminal is mounted on the magnet support frame assembly and coupled to the control circuit board, wherein the magnet support frame assembly is configured to move between a first position farther away from the coil support frame assembly and a second position closer to the coil support frame assembly, wherein at the first position, the input terminal and output terminal are disconnected from each other, and at the second position, the input terminal and output terminal are connected to each other, wherein the coil support frame assembly includes a coil support frame, a first coil and a second coil wound around the coil support frame, and a first iron core and a second iron core respectively nested inside the first coil and second coil, wherein one end of the coil support frame forms a position limiting cavity configured to accommodate the magnet support frame assembly and to limit its position, wherein the position limiting cavity is configured to allow the magnet support frame assembly to move between the first position and the second position, wherein the first iron core is a reset iron core, the second iron core is a trip iron core and is disposed near the magnet support frame assembly, and wherein the magnet support frame assembly includes a magnet support frame and a permanent magnet disposed inside the magnet support frame, and wherein at the first position, the first iron core and the second iron core are in their initial positions which are farther away from the permanent magnet, and at the second position, the second iron core and the permanent magnet are attracted by magnetic force to contact each other.

17. The electric-driven trip and reset mechanism of claim 16, wherein the first coil and the second coil are disposed coaxially, wherein the coil support frame assembly further includes an iron core attachment member disposed between the first iron core and second iron core and a reset spring nested around at least the iron core attachment member, wherein the iron core attachment member has an outwardly extending circular rib, and wherein the reset spring is disposed between the circular rib and the coil support frame and configured to urge at least the iron core attachment member to return to its initial position.

18. The electric-driven trip and reset mechanism of claim 17, wherein the coil support frame assembly further includes a position limiting block, which has a position limiting slot corresponding to the iron core attachment member, configured to abut a side of the circular rib that is opposite the reset spring.

19. The electric-driven trip and reset mechanism of claim 17, wherein the iron core attachment member is fixedly joined to both the first iron core and second iron core to form one body.

20. The electric-driven trip and reset mechanism of claim 17, wherein the iron core attachment member is fixedly joined to the second iron core to form one body, wherein the first iron core is separate from the attachment member, wherein the coil support frame assembly further includes an auxiliary spring disposed around the first iron core and configured to urge the first iron core to its initial position.

21. The electric-driven trip and reset mechanism of claim 16, wherein the position control unit further includes a trip spring, disposed in the position limiting cavity of the coil support frame assembly and configured to urge the magnet support frame assembly toward its first position.

* * * * *